(12) United States Patent
Huang (10) Patent No.: US 12,113,543 B2
(45) Date of Patent: Oct. 8, 2024

(54) ANALOG-TO-DIGITAL CONVERSION CIRCUIT AND METHOD HAVING REMAINED TIME MEASURING MECHANISM

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 178 days.

(21) Appl. No.: 17/972,669

(22) Filed: Oct. 25, 2022

(65) Prior Publication Data

US 2023/0188150 A1  Jun. 15, 2023

(30) Foreign Application Priority Data

Dec. 13, 2021  (TW) .................................. 110146519

(51) Int. Cl.
*H03M 1/12* (2006.01)
*H03K 19/17736* (2020.01)
*H03M 1/36* (2006.01)
*H03M 1/50* (2006.01)

(52) U.S. Cl.
CPC ...... *H03M 1/1245* (2013.01); *H03K 19/1774* (2013.01); *H03M 1/368* (2013.01); *H03M 1/50* (2013.01)

(58) Field of Classification Search
CPC ...... H03M 1/1245; H03M 1/368; H03M 1/50; H03K 19/1774
USPC ................................. 341/155, 158, 161–163
See application file for complete search history.

(56) References Cited

U.S. PATENT DOCUMENTS 9,685,973 B2 * 6/2017 Liu .......................... H03M 1/38
10,116,318 B1 * 10/2018 Sharif ................... H03M 1/125

* cited by examiner

*Primary Examiner* — Khai M Nguyen
(74) *Attorney, Agent, or Firm* — WPAT, P.C.

(57) ABSTRACT

The present invention discloses an analog-to-digital conversion circuit having remained time measuring mechanism is provided. A digital-to-analog conversion (DAC) circuit samples input voltages to generate output voltages. A comparator compares the output voltages to generate a comparison result. A control circuit switches a configuration of the DAC circuit by using a digital code according to the comparison result. A comparison determining circuit sets a stage indication signal at a finished state after the comparison result is generated. A comparison stage counting circuit accumulates a termination number according to the stage indication signal to set a conversion indication signal at the finished state when the termination number reaches a predetermined number. A time accumulating circuit starts to accumulate a remained time when the conversion indication signal is at the finished state and finishes accumulation when a sampling indication signal is at a sampling state.

14 Claims, 5 Drawing Sheets

ANALOG-TO-DIGITAL CONVERSION CIRCUIT AND METHOD HAVING REMAINED TIME MEASURING MECHANISM

BACKGROUND OF THE INVENTION

1. Field of the Invention

The present invention relates to an analog-to-digital conversion circuit and an analog-to-digital conversion method having remained time measuring mechanism.

2. Description of Related Art

An analog-to-digital conversion circuit is a circuit that converts a continuous analog signal or a physical amount (which is typically a voltage) to a digital signal. The analog-to-digital conversion circuit can be implemented by various kinds of configurations. A successive-approximation analog-to-digital conversion circuit requires the operation of a digital-to-analog circuit having different configurations and a comparator to process an analog input signal and perform comparison thereon, so as to track the input signal. However, the operation time of the digital-to-analog circuit and the comparator varies due to factors of such as, but not limited to temperature, process and voltage. When a difference between the operation time and a conversion time set by the system is either too small or too large, the efficiency of the analog-to-digital conversion circuit decreases.

SUMMARY OF THE INVENTION

In consideration of the problem of the prior art, an object of the present invention is to supply an analog-to-digital conversion circuit and an analog-to-digital conversion method having remained time measuring mechanism.

The present invention discloses an analog-to-digital conversion circuit having remained time measuring mechanism that includes a digital-to-analog conversion circuit, a comparator, a control circuit, a comparison determining circuit, a comparison stage counting circuit and a time accumulating circuit. The digital-to-analog conversion circuit is configured to sample a positive terminal input voltage and a negative terminal input voltage when a sampling indication signal is at a sampling state and output a positive terminal output voltage and a negative terminal output voltage when the sampling indication signal is at a sampling finished state. The comparator is configured to, in each of a plurality of comparison stages, compare the positive terminal output voltage and the negative terminal output voltage to generate a comparison result, wherein a number of the comparison stages is a default number. The control circuit is configured to, in each of the comparison stages, switch a configuration of the digital-to-analog conversion circuit by using a set of digital codes according to the comparison result, and configured to output the corresponding set of digital codes as a digital output signal when a conversion finished criteria is satisfied. The comparison determining circuit is configured to, in each of the comparison stages, set a stage indication signal to be a comparison stage unfinished state before the comparison result is generated and set the stage indication signal to be a comparison stage finished state after the comparison result is generated. The comparison stage counting circuit is configured to, in each of the comparison stages, accumulate a number of times that the comparison is finished when the stage indication signal is at the comparison stage finished state, set a conversion indication signal to be a conversion unfinished state before the number of times that the comparison is finished reaches the default number and set the conversion indication signal to be the conversion finished state when the number of times that the comparison is finished reaches the default number. The time accumulating circuit is configured to start to accumulate a remained time when the conversion indication signal is at the conversion finished state and finish accumulation when the sampling indication signal is at the sampling state next time.

The present invention also discloses an analog-to-digital conversion method having remained time measuring mechanism that includes the steps outlined below. A positive terminal input voltage and a negative terminal input voltage are sampled when a sampling indication signal is at a sampling state and a positive terminal output voltage and a negative terminal output voltage are outputted when the sampling indication signal is at a sampling finished state by a digital-to-analog conversion circuit. The positive terminal output voltage and the negative terminal output voltage are compared in each of a plurality of comparison stages to generate a comparison result by a comparator, wherein a number of the comparison stages is a default number. A configuration of the digital-to-analog conversion circuit is switched in each of the comparison stages by using a set of digital codes according to the comparison result by a control circuit, and outputting the corresponding set of digital codes as a digital output signal by the control circuit when a conversion finished criteria is satisfied. A stage indication signal is set to be a comparison stage unfinished state before the comparison result is generated in each of the comparison stages by a comparison determining circuit and the stage indication signal is set to be a comparison stage finished state by the comparison determining circuit after the comparison result is generated. A number of times that the comparison is finished is accumulated when the stage indication signal is at the comparison stage finished state in each of the comparison stages, a conversion indication signal is set to be a conversion unfinished state before the number of times that the comparison is finished reaches the default number and the conversion indication signal is set to be the conversion finished state when the number of times that the comparison is finished reaches the default number by a comparison stage counting circuit. A remained time is started to be accumulated when the conversion indication signal is at the conversion finished state and finishing accumulation when the sampling indication signal is at the sampling state next time by a time accumulating circuit.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide an analog-to-digital conversion circuit and an analog-to-digital conversion method having remained time measuring mechanism to measure a remained time between a transition time set by the system and an actual operation time such that the object of adjusting system operation parameters according to the remained time to increase the efficiency of the analog-to-digital conversion circuit can be accomplished.

Figure 1:
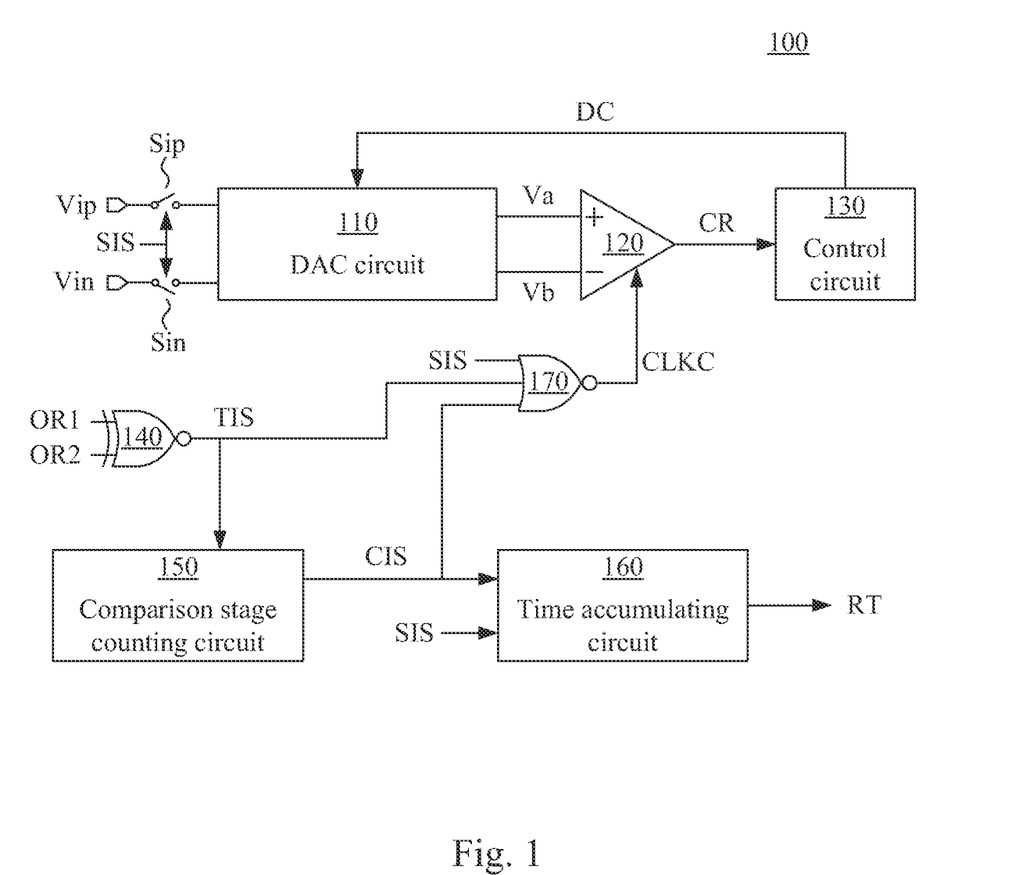
FIG. 1 illustrates a block diagram of an analog-to-digital conversion circuit having remained time measuring mechanism according to an embodiment of the present invention.

Reference is now made to FIG. 1. FIG. 1 illustrates a block diagram of an analog-to-digital conversion circuit 100 having remained time measuring mechanism according to an embodiment of the present invention. The analog-to-digital conversion circuit 100 includes a digital-to-analog conversion (DAC) circuit 110, a comparator 120, a control circuit 130, a comparison determining circuit 140, a comparison stage counting circuit 150 and a time accumulating circuit 160.

In operation, in each round of analog-to-digital conversion, the digital-to-analog conversion circuit 110 samples a positive terminal input voltage Vip and a negative terminal input voltage Vin and outputs a positive terminal output voltage Va and a negative terminal output voltage Vb. The comparator 120 compares the positive terminal output voltage Va and the negative terminal output voltage Vb to generate a comparison result CR. The control circuit 130 generates a set of digital codes DC according to the comparison result CR to switch a configuration of the digital-to-analog conversion circuit 110.

The digital-to-analog conversion circuit 110, the comparator 120 and the control circuit 130 together form a loop to keep performing the procedure described above in a plurality of comparison stages. The control circuit 130 outputs the corresponding set of digital codes DC as a digital output signal DOUT when conversion finished criteria is satisfied.

The number of the comparison stages is a fixed default number. When the analog-to-digital conversion circuit 100 performs the comparison stages for a number of times reaching the default number, a round of the analog-to-digital conversion is determined to be finished being performed.

As result, in an embodiment, the control circuit 130 determines that the conversion finished criteria is satisfied when a difference between the positive terminal output voltage Va and the negative terminal output voltage Vb is smaller than a predetermined level and when the number of times that the comparison is finished reaches the default number. The control circuit 130 further outputs the corresponding digital codes DC as the digital output signal DOUT when the conversion finished criteria is determined to be satisfied.

In an embodiment, the predetermined level described above is an amount of a least significant bit (LSB).

The system of the analog-to-digital conversion circuit 100 sets a conversion time, in which a round of analog-to-digital conversion is performed in the conversion time. However, the actual operation time does not equal to the conversion time, in which the actual operation time is the time that the circuit components included in the analog-to-digital conversion circuit 100 spend to perform comparison and switching to generate the conversion result. The actual operation time may vary due to the factors of temperature, voltage and manufacturing process. The comparison determining circuit 140, the comparison stage counting circuit 150 and the time accumulating circuit 160 operate together to measure the remained time RT between the conversion time and the actual operation time.

The operation of each of the circuit components in the analog-to-digital conversion circuit 100 is described in detail in the following paragraphs.

The digital-to-analog conversion circuit 110 is configured to sample the positive terminal input voltage Vip and the negative terminal input voltage Vin when a the sampling indication signal SIS is at a sampling state. The digital-to-analog conversion circuit 110 is further configured to output the positive terminal output voltage Va and the negative terminal output voltage Vb when the sampling indication signal SIS is at a sampling finished state. The sampling indication signal SIS can be generated by such as, but not limited to a circuit external to the analog-to-digital conversion circuit 100.

In an embodiment, the digital-to-analog conversion circuit 110 may include such as, but not limited to a positive terminal capacitor array, a negative terminal capacitor array and a switching circuit (not illustrated). The positive terminal capacitor array and the negative terminal capacitor array can be respectively coupled to an analog signal source through a switch Sip and a switch Sin.

In an embodiment, the sampling state of the sampling indication signal SIS is a high state and the sampling finished state of the sampling indication signal SIS is a low state. The sampling state of the sampling indication signal SIS enables the switch Sip and the switch Sin such that the positive terminal capacitor array and the negative terminal capacitor array respectively receive the positive terminal input voltage Vip and the negative terminal input voltage Vin. The sampling finished state of the sampling indication signal SIS disables the switch Sip and the switch Sin such that the positive terminal capacitor array and the negative terminal capacitor array are disconnected from the analog signal source. In each of the comparison stages, the switching circuit switches the configuration of the positive terminal capacitor array and the negative terminal capacitor array by receiving the digital codes DC, such that different values of the positive terminal output voltage Va and the negative terminal output voltage Vb are outputted.

As a result, the time length between two consecutive times that the sampling indication signal SIS is at the sampling state is the conversion time set by the system.

The comparator 120, in each of the comparison stages, compares the positive terminal output voltage Va and the negative terminal output voltage Vb to generate the comparison result CR. The number of the comparison stages is the default number. More specifically, the comparison stages need to be performed the default number of times in each round of analog-to-digital conversion performed by the analog-to-digital conversion circuit 100.

Figure 2:
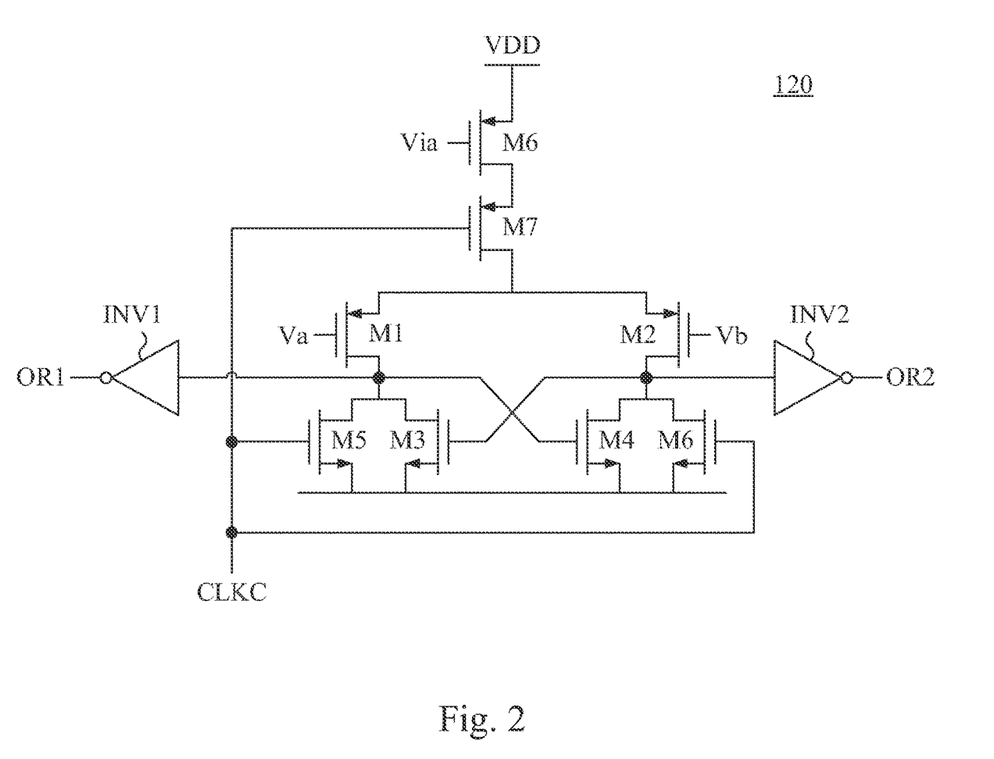
FIG. 2 illustrates a circuit diagram of the comparator according to an embodiment of the present invention.

Reference is now made to FIG. 2. FIG. 2 illustrates a circuit diagram of the comparator 120 according to an embodiment of the present invention. In an embodiment, the comparator 120 includes a plurality of transistors M1-M7 and two inverters INV1 and INV2.

Gates of the P-type transistors M1 and M2 respectively receive the positive terminal output voltage Va and the negative terminal output voltage Vb. A drain and a gate of the N-type transistor M3 are respectively electrically coupled to a drain of the P-type transistor M1 and a drain of P-type transistor M2. A source of the N-type transistor M3 is grounded. A drain and a gate of the N-type transistor M4 are respectively electrically coupled to the drain of the P-type transistor M2 and the drain of the P-type transistor M1. A source of the N-type transistor M4 is grounded. A drain of the N-type transistor M5 is electrically coupled to the drain of the P-type transistor M1. A gate of the N-type transistor M5 receives an enabling signal CLKC. A source of the N-type transistor M5 is grounded. A drain of the N-type transistor M6 is electrically coupled to the drain of the P-type transistor M2. A gate of the N-type transistor M6 receives the enabling signal CLKC. A source of the N-type transistor M6 is grounded.

The P-type transistors M6 and M7 are coupled in series between a voltage source VDD and sources of the P-type transistors M1 and M2. A gate of the P-type transistor M6 receives a bias voltage Via. A gate of the P-type transistors M7 receives the enabling signal CLKC. The two inverters INV1 and INV2 are respectively electrically coupled to the drains of the P-type transistors M1 and M2 to generate an output result OR1 and an output result OR2 according to the input of the positive terminal output voltage Va and the negative terminal output voltage Vb.

In an embodiment, the analog-to-digital conversion circuit 100 further includes an enabling logic circuit 170, which is a NOR gate, to generate the enabling signal CLKC according to the different states of the sampling indication signal SIS, a stage indication signal TIS and a conversion indication signal CIS. The generation of the stage indication signal TIS and the conversion indication signal CIS is described in detail in the following paragraphs.

As described above, the sampling indication signal SIS indicates whether the sampling is finished being performed according to whether the sampling indication signal SIS is at the sampling state or at the sampling finished state, wherein the sampling state is a high state and the sampling finished state is a low state. The stage indication signal TIS indicates whether a comparison stage is finished being performed according to whether the stage indication signal TIS is at a comparison stage unfinished state or a comparison stage finished state, wherein the comparison stage unfinished state is a low state and the comparison stage finished state is a high state. The conversion indication signal CIS indicates whether the analog-to-digital conversion is finished being performed according to whether conversion indication signal CIS is at a conversion unfinished state or a conversion finished state, wherein the conversion unfinished state is a low state and the conversion finished state is a high state.

As a result, when the analog-to-digital conversion circuit 100 begins to perform analog-to-digital conversion, the sampling indication signal SIS is at the sampling state, the stage indication signal TIS is at the comparison stage unfinished state and the conversion indication signal CIS is at the conversion unfinished state. The enabling logic circuit 170 generates the enabling signal CLKC at the low state to disable the comparator 120. Under such a condition, the output result OR1 and the output result OR2 are both at the low state. The comparison result CR is not generated yet.

Subsequently, the sampling indication signal SIS is at the sampling finished state to finish sampling. The stage indication signal TIS is still at the comparison stage unfinished state and the conversion indication signal CIS is still at the conversion unfinished state. The enabling logic circuit 170 generates the enabling signal CLKC at the high state accordingly to enable the comparator 120 to perform comparison.

Further, when one of the output result OR1 and the output result OR2 is at the high state and the other one is at the low state, the comparison result CR illustrated in FIG. 1 is generated. The stage indication signal TIS is at the comparison stage finished state due to the generation of the comparison result CR. Under such a condition, the sampling indication signal SIS is at the sampling finished state (low state), the stage indication signal TIS is at the comparison stage finished state (high state) and the conversion indication signal CIS is at the conversion unfinished state (low state). The enabling logic circuit 170 enabling logic circuit 170 generates the enabling signal CLKC at the low state accordingly to disable the comparator 120.

The disabled comparator 120 sets both of the output result OR1 and the output result OR2 at the low state again such that the comparison result CR goes back to the state indicating that the comparison is not finished being performed. The enabling logic circuit 170 generates the enabling signal CLKC at the high state accordingly to enable the comparator 120 to perform comparison.

As a result, the comparator 120 repeats the operation described above in each of the comparison stages after the sampling is finished until all the comparison stages are finished being performed to finish a round of analog-to-digital conversion such that the conversion indication signal CIS is at the conversion finished state. The comparator 120 is disabled and the sampling is performed again to further perform the next round of analog-to-digital conversion.

The control circuit 130, in each of the comparison stages, switches the configuration of the digital-to-analog conversion circuit 110 by using the set of the digital codes DC according to the comparison result CR. The control circuit 130, further outputs the corresponding set of digital codes DC as the digital output signal DOUT when the conversion finished criteria is satisfied.

The comparison determining circuit 140 receives the output result OR1 and the output result OR2. In each of the comparison stages, the comparison determining circuit 140 sets the stage indication signal TIS to be the comparison stage unfinished state before the comparison result CR is generated (which is indicated by the low states of both of the output result OR1 and the output result OR2), and sets the stage indication signal TIS to be the comparison stage finished state after the comparison result CR is generated (which is indicated by the low state of one of the output result OR1 and the output result OR2 and the high state of another one of the output result OR1 and the output result OR2). In an embodiment, the comparison determining circuit 140 is implemented by a XOR gate.

The comparison stage counting circuit 150, in each of the comparison stages, accumulates a number of times that the comparison is finished when the stage indication signal TIS is at the comparison stage finished state, set the conversion indication signal CIS to be the conversion unfinished state before the number of times that the comparison is finished reaches the default number and set the conversion indication signal CIS to be the conversion finished state when the number of times that the comparison is finished reaches the default number. In an embodiment, the conversion unfinished state is at the low state and the conversion finished state is at the high state.

Figure 3:
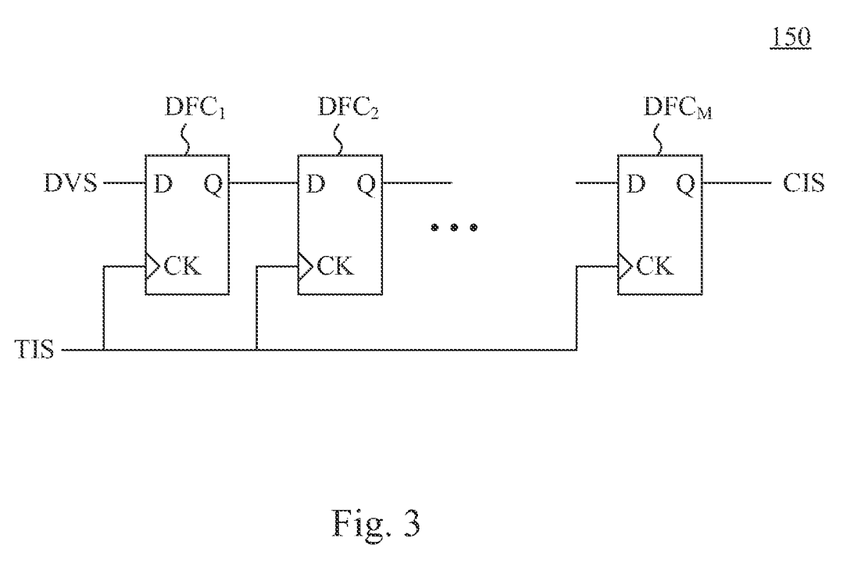
FIG. 3 illustrates a circuit diagram of the comparison stage counting circuit according to an embodiment of the present invention.

Reference is now made to FIG. 3. FIG. 3 illustrates a circuit diagram of the comparison stage counting circuit 150 according to an embodiment of the present invention. The comparison stage counting circuit 150 includes a plurality of counting D flip-flops $DFC_1$-$DFC_M$ coupled in series. Each of the counting D flip-flops $DFC_1$-$DFC_M$ includes an input terminal D, an output terminal Q and a clock input terminal CK.

The input terminal D of the first counting D flip-flop $DFC_1$ receives a triggering signal DVS and the triggering signal DVS is at the high state. The output terminal Q of each of the counting D flip-flops is electrically coupled to the input terminal D of a next one of the counting D flip-flops. The clock input terminal CK receives the stage indication signal TIS.

In an embodiment, the output terminal of each of the counting D flip-flops $DFC_1$-$DFC_M$ is reset to the low state in the beginning of a round of analog-to-digital conversion performed by the analog-to-digital conversion circuit 100 (e.g., when the sampling begins to be performed). Each of the counting D flip-flops $DFC_1$-$DFC_M$ is in turn triggered by the comparison stage finished state (high state) of the stage indication signal TIS corresponding to one of the comparison stages to output the triggering signal DVS to the output terminal Q.

More specifically, the comparison determining circuit 140, in each of the comparison stages, sets the stage indication signal TIS from the comparison stage unfinished state to the comparison stage finished state (i.e., from the low state to the high state) according to the comparison result CR. Every time the stage indication signal TIS is at the comparison stage finished state, one of the counting D flip-flops is triggered such that the triggering signal DVS is transmitted one after another through the counting D flip-flops $DFC_1$-$DFC_M$ coupled in series. The output terminal Q of the last counting D flip-flop $DFC_M$ outputs the conversion indication signal CIS at the conversion unfinished state (low state) before being triggered, and outputs the triggering signal DVS as the conversion indication signal CIS at the conversion finished state (high state) only when being triggered.

In an embodiment, the number of the counting D flip-flops equals to the default number of the comparison stages. The triggering of one of the counting D flip-flops is equivalent to an accumulation of the number of times that the comparison is finished.

For example, when the analog-to-digital conversion circuit 100 only needs four comparison stages to perform analog-to-digital conversion, four counting D flip-flops are triggered in turn such that the output terminal of each of the fourth counting D flip-flop outputs the conversion indication signal CIS at the conversion finished state when being triggered. Four times that the comparison is finished can be accumulated accordingly.

The time accumulating circuit 160 starts to accumulate the remained time RT when the conversion indication signal CIS is at the conversion finished state and finishes accumulation when the sampling indication signal SIS is at the sampling state next time.

Figure 4:
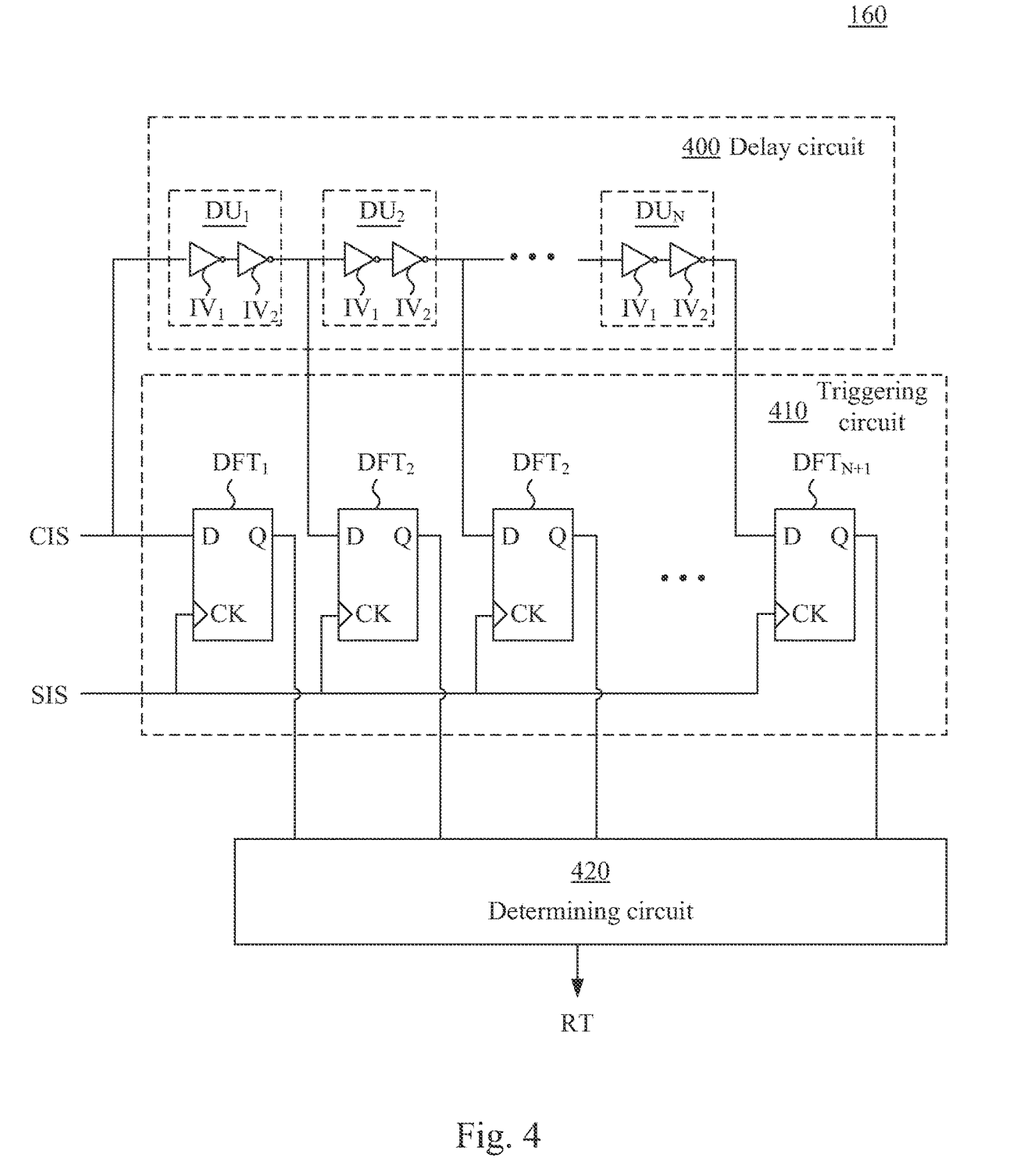
FIG. 4 illustrates a circuit diagram of the time accumulating circuit according to an embodiment of the present invention.

Reference is now made to FIG. 4. FIG. 4 illustrates a circuit diagram of the time accumulating circuit 160 according to an embodiment of the present invention. The time accumulating circuit 160 includes a delay circuit 400, a triggering circuit 410 and a determining circuit 420.

The delay circuit 400 includes a plurality of delay units $DU_1$-$DU_N$ coupled in series and configured to transmit the conversion indication signal CIS. In an embodiment, each of the delay units $DU_1$-$DU_N$ includes an even number of inverters coupled in series, such that the conversion indication signal CIS outputted by each of the delay units $DU_1$-$DU_N$ has the same state. In the present embodiment, two inverters $IV_1$ and $IV_2$ coupled in series are illustrated as an example. However, the present invention is not limited thereto.

The triggering circuit 410 includes a plurality of triggering D flip-flops $DFT_1$-$DFT_{N+1}$ coupled in series. Each of the triggering D flip-flops $DFT_1$-$DFT_{N+1}$ includes an input terminal D, an output terminal Q and a clock input terminal CK.

The input terminal D of the first triggering D flip-flop $DFT_1$ is configured to directly receive the conversion indication signal CIS. The input terminal D of each of the other triggering D flip-flops $DFT_2$-$DFT_N$ is electrically coupled to one of the delay units $DU_1$-$DU_N$ to receive the conversion indication signal CIS transmitted by one of the delay units $DU_1$-$DU_N$. In the present embodiment, the number of the triggering D flip-flops $DFT_2$-$DFT_{N+1}$ is more than the number of the delay units $DU_1$-$DU_N$ by 1. The clock input terminal CLK receives the sampling indication signal SIS.

The determining circuit 420 is electrically coupled to the output terminal Q of each of the triggering D flip-flops $DFT_1$-$DFT_N$.

In an embodiment, the output terminal of each of the delay units $DU_1$-$DU_N$ is reset to the low state in the beginning of a round of analog-to-digital conversion performed by the analog-to-digital conversion circuit 100 (e.g., when the sampling begins to be performed). The output terminal of each of the delay units $DU_1$-$DU_N$ in turns transmits the conversion indication signal CIS during the process of analog-to-digital conversion. The output terminal Q of each of the triggering D flip-flops $DFT_1$-$DFT_N$ outputs the conversion indication signal CIS when the sampling indication signal SIS is at sampling state (high state) next time.

According to the number of the triggering D flip-flops that output the conversion indication signal CIS at the conversion finished state, the determining circuit 420 determines a total delay time length of the delay units that transmit the conversion indication signal CIS at the conversion finished state, in which the total delay time length serves as the remained time RT.

For example, after the comparison determining circuit 140 determines that the analog-to-digital conversion is finished being performed and switches the conversion indication signal CIS from the conversion unfinished state to the conversion finished state, each of the delay units $DU_1$-$DU_N$ in turns receives and transmits the conversion indication signal CIS. When the sampling indication signal SIS is at sampling state next time (the next round of analog-to-digital conversion process), the conversion indication signal CIS at the conversion finished state is transmitted to the fourth delay units $DU_4$, and the other delay units $DU_5$-$DU_N$ still output the conversion indication signal CIS at the conversion unfinished state.

Under such a condition, the output terminal Q of each of the triggering D flip-flops $DFT_1$-$DFT_5$ outputs the conversion indication signal CIS at the conversion finished state under the triggering of the sampling indication signal SIS. The output terminal Q of each of the triggering D flip-flops $DFT_6$-$DFT_{N+1}$ outputs the conversion indication signal CIS at the conversion unfinished state under the triggering of the sampling indication signal SIS.

As a result, according to the number of the triggering D flip-flops $DFT_1$-$DFT_5$ that output the conversion indication signal CIS at the conversion finished state, which is 5, the determining circuit 420 determines the number of the delay units $DU_1$-$DU_4$ that transmit the conversion indication signal CIS at the conversion finished state, which is 4. The determining circuit 420 further multiplies a unit delay time that a single delay unit required to transmit the signal by the number of the delay units to obtain the total delay time length, in which the total delay time length serves as the remained time RT. In a numerical example, the unit delay time of a single delay unit is 0.1-0.2 nanoseconds. Take the unit delay time of 0.1 nanosecond as an example, the total delay time length of four delay units is 0.4 nanoseconds.

The time length between two consecutive times that the sampling indication signal SIS is at sampling state is the conversion time set by the system. However, the operation time that corresponds to the timing when the conversion indication signal CIS becomes the conversion finished state does not equal to the conversion time, the analog-to-digital conversion circuit 100 can measure the remained time RT between the conversion time and the actual operation time by using the mechanism described above.

In an embodiment, the analog-to-digital conversion circuit 100 adjusts at least one operation parameter according to the remained time RT. The operation parameter includes a loop speed, an operation voltage, an operation current of the digital-to-analog conversion (DAC) circuit or a combination thereof. The operation parameter can be adjusted by such as, but not limited to the control circuit 130.

As a result, the analog-to-digital conversion circuit having remained time measuring mechanism of the present invention can measure the remained time between the conversion time set by the system and the actual operation time to accomplish the object of adjust the system operation parameters according to the remained time to increase the efficiency of the analog-to-digital conversion circuit.

It is appreciated that the circuit configuration and the number of the components included in each of the circuits described above are merely an example. In different embodiments, the circuit configuration and the number of the components included in the circuits can be modified depending on practical requirements without affecting the function of the system. Further, the logic circuit and the states of high and low related thereto described above are merely an example. In different embodiments, the other logic circuits can be used or can be operated according to the states that are the inverse of the states described above depending on practical requirements without affecting the function of the system. The present invention is not limited thereto.

Figure 5:
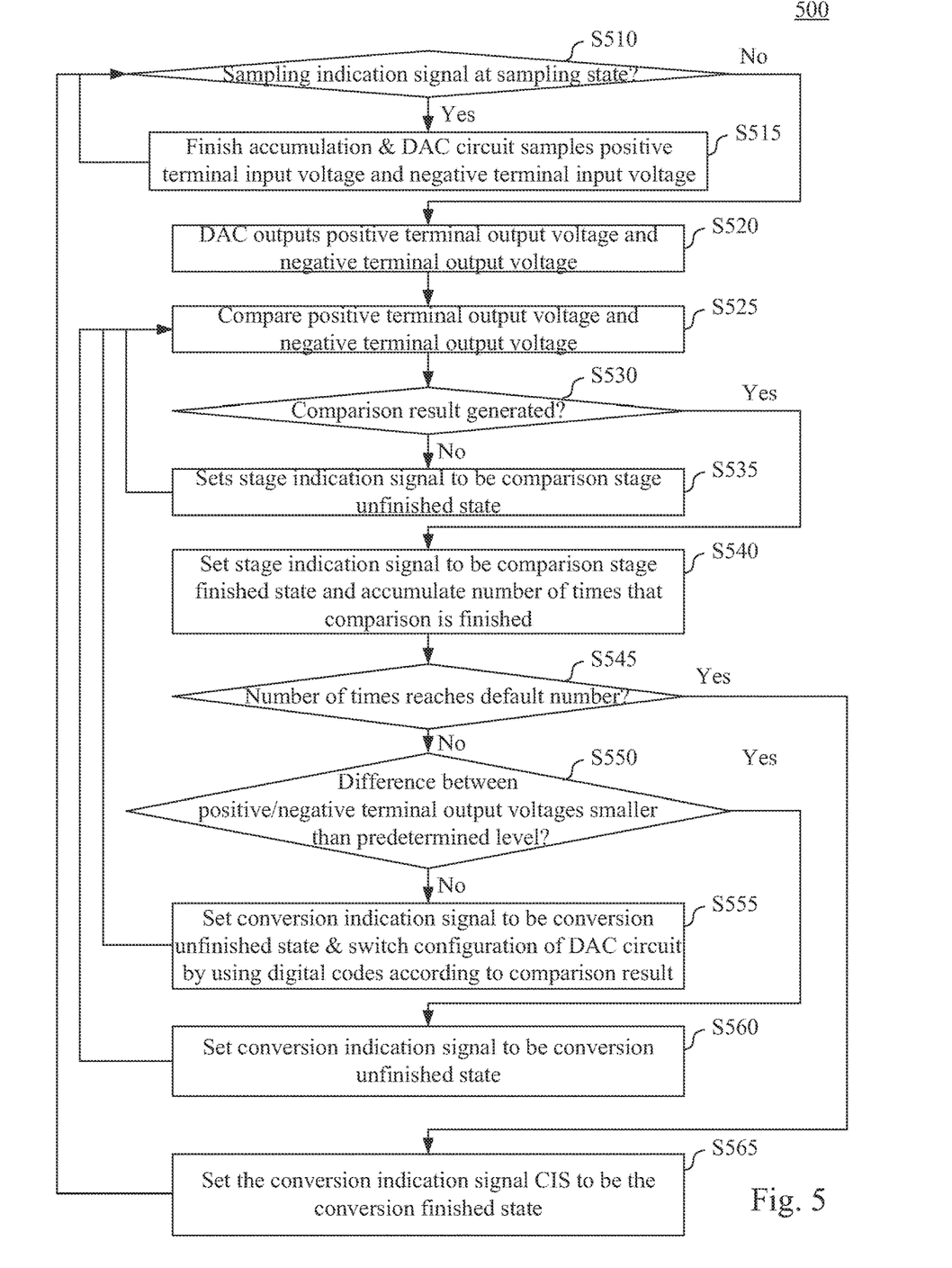
FIG. 5 illustrates a flow chart of an analog-to-digital conversion method having remained time measuring mechanism according to an embodiment of the present invention.

Reference is now made to FIG. 5. FIG. 5 illustrates a flow chart of a analog-to-digital conversion method 500 having remained time measuring mechanism according to an embodiment of the present invention.

In addition to the apparatus described above, the present disclosure further provides the analog-to-digital conversion method 500 having remained time measuring mechanism that can be used in such as, but not limited to, the analog-to-digital conversion circuit 100 in FIG. 1. As illustrated in FIG. 5, an embodiment of the analog-to-digital conversion method 500 includes the following steps.

In step S510, whether the sampling indication signal SIS is at the sampling state is determined.

In step S515, when the sampling indication signal SIS is at the sampling state, the accumulation of the remained time RT of the previous round of analog-to-digital conversion is finished. The digital-to-analog conversion circuit 110 samples the positive terminal input voltage Vip and the negative terminal input voltage Vin for the new round of analog-to-digital conversion.

In step S520, when the sampling indication signal SIS is at sampling finished state, the digital-to-analog conversion circuit 110 outputs the positive terminal output voltage Va and the negative terminal output voltage Vb.

In step S525, the comparator 120 compares the positive terminal output voltage Va and the negative terminal output voltage Vb.

In step S530, the comparison determining circuit 140 whether the comparison result CR is generated.

In step S535, before the comparison result CR is generated, the comparison determining circuit 140 sets the stage indication signal TIS to be the comparison stage unfinished state. The flow goes back to step S525 to keep performing comparison.

In step S540, after the comparison result CR is generated, the comparison determining circuit 140 sets the stage indication signal TIS to be the comparison stage finished state. The comparison stage counting circuit 150 accumulates the number of times that the comparison is finished according to the stage indication signal TIS at the comparison stage finished state.

In step S545, the comparison stage counting circuit 150 determines whether the number of times that the comparison is finished reaches the default number.

In step S550, when the number of times that the comparison is finished does not reach the default number, the control circuit 130 further determines whether the difference between the positive terminal output voltage Va and the negative terminal output voltage Vb is smaller than the predetermined level.

In step S555, when the difference between the positive terminal output voltage and the negative terminal output voltage is not smaller than the predetermined level, the comparison stage counting circuit 150 sets the conversion indication signal CIS to be the conversion unfinished state. The control circuit 130 switches the configuration of the digital-to-analog conversion circuit 110 by using the set of digital codes DC according to the comparison result CR. The flow goes back to step S525 to perform the comparison of the next comparison stage.

In step S560, when the difference between the positive terminal output voltage Va and the negative terminal output voltage Vb is smaller than the predetermined level, the comparison stage counting circuit 150 sets the conversion indication signal CIS to be the conversion unfinished state. In an embodiment, the control circuit 130 still switches the configuration of the digital-to-analog conversion circuit 110 by using the set of digital codes DC according to the comparison result CR. The flow goes back to step S525 to perform the comparison of the next comparison stage.

In step S565, when the number of times that the comparison is finished reaches the default number, the comparison stage counting circuit 150 sets the conversion indication signal CIS to be the conversion finished state. The time accumulating circuit 160 starts to accumulate the remained time RT. The control circuit 130 determines the conversion finished criteria is satisfied and outputs the corresponding digital codes DC as the digital output signal DOUT. The flow goes back to step S510 such that the accumulation is finished when the sampling indication signal SIS is at sampling state next time.

It is appreciated that the embodiments described above are merely an example. In other embodiments, it should be appreciated that many modifications and changes may be made by those of ordinary skill in the art without departing from the spirit of the disclosure.

In summary, the present invention discloses the analog-to-digital conversion circuit and the analog-to-digital conversion method having remained time measuring mechanism that measure the remained time between the conversion time set by the system and the actual operation time to accomplish the object of adjust the system operation parameters according to the remained time to increase the efficiency of the analog-to-digital conversion circuit.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An analog-to-digital conversion circuit having remained time measuring mechanism, comprising:
a digital-to-analog conversion circuit configured to sample a positive terminal input voltage and a negative terminal input voltage when a sampling indication signal is at a sampling state and output a positive terminal output voltage and a negative terminal output voltage when the sampling indication signal is at a sampling finished state;
a comparator configured to, in each of a plurality of comparison stages, compare the positive terminal output voltage and the negative terminal output voltage to generate a comparison result, wherein a number of the comparison stages is a default number;
a control circuit configured to, in each of the comparison stages, switch a configuration of the digital-to-analog conversion circuit by using a set of digital codes according to the comparison result, and configured to output the corresponding set of digital codes as a digital output signal when a conversion finished criteria is satisfied;
a comparison determining circuit configured to, in each of the comparison stages, set a stage indication signal to be a comparison stage unfinished state before the comparison result is generated and set the stage indication signal to be a comparison stage finished state after the comparison result is generated;
a comparison stage counting circuit configured to, in each of the comparison stages, accumulate a number of times that the comparison is finished when the stage indication signal is at the comparison stage finished state, set a conversion indication signal to be a conversion unfinished state before the number of the number of times that the comparison is finished reaches the default number and set the conversion indication signal to be the conversion finished state when the number of times that the comparison is finished reaches the default number; and
a time accumulating circuit configured to start to accumulate a remained time when the conversion indication signal is at the conversion finished state and finish accumulation when the sampling indication signal is at the sampling state next time.

2. The analog-to-digital conversion circuit of claim 1, further comprising:
an enabling logic circuit configured to enable the comparator when the sampling indication signal is at the sampling finished state, when the stage indication signal is at the comparison stage unfinished state and the conversion indication signal is at the conversion unfinished state.

3. The analog-to-digital conversion circuit of claim 1, wherein the comparison stage counting circuit comprises:
a plurality of counting D flip-flops coupled in series, each comprising:
an input terminal, wherein the input terminal of a first one of the counting D flip-flops is configured to receive a triggering signal;
an output terminal electrically coupled to the input terminal of a next one of the counting D flip-flops; and
a clock input terminal configured to receive the stage indication signal;
wherein each of the counting D flip-flops is in turn triggered by the comparison stage finished state of the stage indication signal corresponding to one of the comparison stages to output the triggering signal to the output terminal, and the output terminal of a last one of the counting D flip-flops outputs the triggering signal as the conversion indication signal at the conversion finished state only when being triggered;
wherein a number of the counting D flip-flops equals to the default number.

4. The analog-to-digital conversion circuit of claim 1, wherein the time accumulating circuit comprises:
a delay circuit comprising a plurality of delay units coupled in series and configured to transmit the conversion indication signal;
a triggering circuit comprising a plurality of triggering D flip-flops coupled in series, each comprising:
an input terminal, wherein the input terminal of a first one of the triggering D flip-flops is configured to receive the conversion indication signal directly and each of the other triggering D flip-flops is electrically coupled to one of the delay units to receive the conversion indication signal that the one of the delay units transmit;
an output terminal; and
a clock input terminal configured to receive the sampling indication signal; and
a determining circuit electrically coupled to the output terminal of each of the triggering D flip-flops;
wherein the output terminal of each of the triggering D flip-flops outputs the conversion indication signal when the sampling indication signal is at the sampling state next time, such that the determining circuit determines a total delay time length of the delay units that transmit the conversion indication signal at the conversion finished state according to a number of the triggering D flip-flops that outputs the conversion indication signal at the conversion finished state, in which the total delay time length serves as the remained time.

5. The analog-to-digital conversion circuit of claim 4, wherein each of the delay units comprises an even number of inverters coupled in series.

6. The analog-to-digital conversion circuit of claim 1, wherein at least one operation parameter of the analog-to-digital conversion circuit is adjusted according to the remained time, and the operation parameter comprises a loop speed, an operation voltage, an operation current of the digital-to-analog conversion (DAC) circuit or a combination thereof.

7. The analog-to-digital conversion circuit of claim 1, wherein the conversion finished criteria is satisfied when a difference between the positive terminal output voltage and the negative terminal output voltage is smaller than a predetermined level and the number of times that the comparison is finished reaches the default number.

8. An analog-to-digital conversion method having remained time measuring mechanism, comprising:
sampling a positive terminal input voltage and a negative terminal input voltage when a sampling indication signal is at a sampling state and outputting a positive terminal output voltage and a negative terminal output voltage when the sampling indication signal is at a sampling finished state by a digital-to-analog conversion circuit;

comparing the positive terminal output voltage and the negative terminal output voltage in each of a plurality of comparison stages to generate a comparison result by a comparator, wherein a number of the comparison stages is a default number;

switching a configuration of the digital-to-analog conversion circuit in each of the comparison stages by using a set of digital codes according to the comparison result by a control circuit, and outputting the corresponding set of digital codes as a digital output signal by the control circuit when a conversion finished criteria is satisfied;

setting a stage indication signal to be a comparison stage unfinished state before the comparison result is generated in each of the comparison stages by a comparison determining circuit and setting the stage indication signal to be a comparison stage finished state by the comparison determining circuit after the comparison result is generated;

accumulating a number of times that the comparison is finished when the stage indication signal is at the comparison stage finished state in each of the comparison stages, setting a conversion indication signal to be a conversion unfinished state before the number of times that the comparison is finished reaches the default number and setting the conversion indication signal to be the conversion finished state when the number of times that the comparison is finished reaches the default number by a comparison stage counting circuit; and starting to accumulate a remained time when the conversion indication signal is at the conversion finished state and finishing accumulation when the sampling indication signal is at the sampling state next time by a time accumulating circuit.

9. The analog-to-digital conversion method of claim 8, further comprising:

enabling the comparator when the sampling indication signal is at the sampling finished state, when the stage indication signal is at the comparison stage unfinished state and the conversion indication signal is at the conversion unfinished state by an enabling logic circuit.

10. The analog-to-digital conversion method of claim 8, wherein the comparison stage counting circuit comprises a plurality of counting D flip-flops coupled in series, each comprising an input terminal, an output terminal and a clock input terminal, wherein the input terminal of a first one of the counting D flip-flops is configured to receive a triggering signal, the output terminal is electrically coupled to the input terminal of a next one of the counting D flip-flops and a clock input terminal is configured to receive the stage indication signal, the analog-to-digital conversion method comprising:

triggering each of the counting D flip-flops is in turn by the comparison stage finished state of the stage indication signal corresponding to one of the comparison stages to output the triggering signal to the output terminal; and outputting the triggering signal as the conversion indication signal at the conversion finished state by the output terminal of a last one of the counting D flip-flops only when being triggered;

wherein a number of the counting D flip-flops equals to the default number.

11. The analog-to-digital conversion method of claim 8, wherein the time accumulating circuit comprises a delay circuit, a triggering circuit and a determining circuit, wherein the delay circuit comprises a plurality of delay units coupled in series and configured to transmit the conversion indication signal, the triggering circuit comprises a plurality of triggering D flip-flops coupled in series each comprising an input terminal, an output terminal and a clock input terminal in which the input terminal of a first one of the triggering D flip-flops is configured to receive the conversion indication signal directly and each of the other triggering D flip-flops is electrically coupled to one of the delay units to receive the conversion indication signal that the one of the delay units transmit and the clock input terminal is configured to receive the sampling indication signal, and the determining circuit electrically coupled to the output terminal of each of the triggering D flip-flops, the analog-to-digital conversion method comprising:

outputting the conversion indication signal by the output terminal of each of the triggering D flip-flops when the sampling indication signal is at the sampling state next time; and determining a total delay time length of the delay units that transmit the conversion indication signal at the conversion finished state according to a number of the triggering D flip-flops that outputs the conversion indication signal at the conversion finished state by the determining circuit, in which the total delay time length serves as the remained time.

12. The analog-to-digital conversion method of claim 11, wherein each of the delay units comprises an even number of inverters coupled in series.

13. The analog-to-digital conversion method of claim 8, wherein at least one operation parameter of the analog-to-digital conversion circuit is adjusted according to the remained time, and the operation parameter comprises a loop speed, an operation voltage, an operation current of the digital-to-analog conversion (DAC) circuit or a combination thereof.

14. The analog-to-digital conversion method of claim 8, further comprising:

determining the conversion finished criteria is satisfied when a difference between the positive terminal output voltage and the negative terminal output voltage is smaller than a predetermined level and the number of times that the comparison is finished reaches the default number.

\* \* \* \* \*